United States Patent
Kneissl et al.

(10) Patent No.: US 6,724,013 B2
(45) Date of Patent: Apr. 20, 2004

(54) EDGE-EMITTING NITRIDE-BASED LASER DIODE WITH P-N TUNNEL JUNCTION CURRENT INJECTION

(75) Inventors: Michael A. Kneissl, Mountain View, CA (US); Peter Kiesel, Burgthann (DE); Christian G. Van de Walle, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/024,417

(22) Filed: Dec. 21, 2001

(65) Prior Publication Data

US 2003/0116767 A1 Jun. 26, 2003

(51) Int. Cl.⁷ .................. H01L 31/12; H01L 31/072; H01L 31/109
(52) U.S. Cl. ............... 257/79; 257/13; 257/14; 257/94; 257/189
(58) Field of Search ................ 257/79, 209, 411, 257/200, 199, 196, 183, 94, 96, 97, 102, 103, 189, 13, 14; 438/47, 94

(56) References Cited

U.S. PATENT DOCUMENTS

| | | | |
|---|---|---|---|
| 5,166,761 A | 11/1992 | Olson et al. | 257/46 |
| 5,796,771 A * | 8/1998 | DenBaars et al. | 372/75 |
| 5,821,569 A * | 10/1998 | Dutta | 257/96 |
| 5,936,266 A * | 8/1999 | Holonyak et al. | 257/106 |
| 6,153,894 A * | 11/2000 | Udagawa | 257/96 |
| 6,172,382 B1 * | 1/2001 | Nagahama et al. | 257/94 |
| 6,194,241 B1 * | 2/2001 | Tsutsui et al. | 438/46 |
| 6,233,265 B1 * | 5/2001 | Bour et al. | 372/45 |
| 6,233,267 B1 * | 5/2001 | Nurmikko et al. | 372/46 |
| 6,526,083 B1 * | 2/2003 | Kneissl et al. | 372/50 |
| 2002/0110945 A1 * | 8/2002 | Kuramata et al. | 438/36 |
| 2003/0053504 A1 * | 3/2003 | Bour et al. | 372/46 |

* cited by examiner

*Primary Examiner*—Amir Zarabian
*Assistant Examiner*—Ida M. Soward

(57) ABSTRACT

A p-n tunnel junction between a p-type semiconductor layer and a n-type semiconductor layer provides current injection for an edge-emitting nitride based semiconductor laser structure. The amount of p-type material in the nitride based semiconductor laser structure can be minimized, with attendant advantages in electrical, thermal, and optical performance, and in fabrication.

13 Claims, 2 Drawing Sheets

EDGE-EMITTING NITRIDE-BASED LASER DIODE WITH P-N TUNNEL JUNCTION CURRENT INJECTION

CROSS-REFERENCE TO RELATED APPLICATIONS

This application contains subject matter that is related to subject matter of U.S. patent application Ser. No. 10/024,418 entitled "NITRIDE-BASED VCSEL OR LIGHT EMITTING DIODE WITH P-N TUNNEL JUNCTION CURRENT INJECTION", filed concurrently with this application, commonly assigned to the same assignee herein and herein incorporated by reference.

BACKGROUND OF THE INVENTION

The present invention relates to an indium gallium aluminum nitride-based edge-emitting laser diode structure and, more particularly, to a p-n tunnel junction for current injection for the indium gallium aluminum nitride edge-emitting nitride based laser diode structure.

Solid state lasers, also referred to as semiconductor lasers or laser diodes, are well known in the art. These devices generally consist of a planar multi-layered semiconductor structure having one or more active semiconductor layers bounded at their side ends by cleaved surfaces that act as mirrors. The semiconductor layers on one side of the active layer in the structure are doped with impurities so as to have an excess of mobile electrons. These layers with excess electrons are said to be n-type, i.e. negative. The semiconductor layers on the other side of the active layer in the structure are doped with impurities so as to have a deficiency of mobile electrons, therefore creating an excess of positively charged carriers called holes. These layers with excess holes are said to be p-type, i.e. positive.

An electrical potential is applied through electrodes between the p-side and the n-side of the layered structure, thereby driving either holes or electrons or both in a direction perpendicular to the planar layers across the p-n junction so as to "inject" them into the active layers, where electrons recombine with holes to produce light. Optical feedback is provided by the cleaved mirrors and a standing wave is formed between the mirrors in the laser resonator with a wave front parallel to the mirrors. If the optical gain produced in the active layers exceeds the optical loss in the laser structure amplified stimulated emission is produced and coherent laser light is emitted through the mirrored edges of the semiconductor laser structure.

Nitride based semiconductors, also known as group III nitride semiconductors or Group III-V nitride semiconductors, comprise elements selected from group II, such as Al, Ga and In, and the group V element N of the periodic table. The nitride based semiconductors can be binary compounds such as gallium nitride (GaN), as well as ternary alloys of aluminum gallium nitride (AlGaN) or indium aluminum nitride (InGaN), and quarternary alloys such as indium gallium aluminum nitride (InGaAlN). These materials are deposited on substrates to produce layered semiconductor structures usable as light emitters for optoelectronic device applications. Nitride based semiconductors have the wide bandgap necessary for short-wavelength visible light emission in the green to blue to violet to the ultraviolet spectrum.

These materials are particularly suited for use in short-wavelength light emitting devices for several important reasons. Specifically, the InGaAlN system has a large bandgap covering the entire visible spectrum. III-V nitrides also provide the important advantage of having a strong chemical bond which makes these materials highly stable and resistant to degradation under the high electric current and the intense light illumination conditions that are present at active regions of the devices. These materials are also resistant to dislocation formation once grown.

Semiconductor laser structures comprising nitride semiconductor layers grown on a sapphire substrate will emit light in the ultra-violet to visible spectrum within a range including 280 nm to 650 nm.

The shorter wavelength violet of nitride based semiconductor laser diodes provides a smaller spot size and a better depth of focus than the longer wavelength of red and infrared (IR) laser diodes for high-resolution or high-speed laser printing operations and high density optical storage. In addition, blue lasers can potentially be combined with existing red and green lasers to create projection displays and color film printers. The emission wavelength of GaN-based lasers and LEDs with an AlGaN or AlInGaN active region can be tuned into the UV range of the spectrum. Emission wavelength around 340 nm and 280 nm are particularly interesting for the optical excitation of biomolecules in bacteria, spores and viruses, which can be applied e.g. in bioagent detection systems.

A prior art nitride based semiconductor laser structure 100 of FIG. 1 has a sapphire ($Al_2O_3$) substrate 102 on which is epitaxially deposited a succession of semiconductor layers. The sapphire substrate 102 typically has a thickness of 200 micron to 1000 micron.

The prior art laser structure 100 includes an n-type III-V nitride nucleation layer 104 formed on the sapphire substrate 102. Typically, the buffer layer 104 is undoped GaN and has typically a thickness in the range between 10 nm and 30 nm.

A III-V nitride contact and current-spreading layer 106 is formed on the nucleation layer 104. The III-V nitride layer 106 is an n-type GaN:Silayer acting as a lateral n-contact and current spreading layer. The contact and current spreading layer 106 typically has a thickness of from about 1 $\mu$m to about 20 $\mu$m.

A III-V nitride cladding layer 108 is formed over the contact layer 106. The III-V nitride layer 106 is an n-type AlGaN:Si cladding layer. The cladding layer 106 typically has a thickness of from about 0.2 $\mu$m to about 2 $\mu$m.

On top of the III-V nitride cladding layer 108, a III-V nitride waveguide layer 110 is formed followed by the III-V nitride quantum well active region 112. The n-type GaN:Si waveguide layer 110 typically has a thickness of from about 50 nm to about 200 nm. The quantum well active region 112 is comprised of at least one InGaN quantum well. For multiple-quantum well active regions, the individual quantum wells typically have a thickness of from about 10 Å to about 100 Å and are separated by InGaN or GaN barrier layers which have typically a thickness of from about 10 Å to about 200 Å.

A III-V nitride waveguide layer 114 is formed over the quantum well active region 112. The p-type GaN:Mg layer 114 serves as a waveguide layer and has a thickness of from about 50 nm to about 200 nm.

A III-V nitride cladding layer 116 is formed over the waveguide layer 114. The p-type AlGaN:Mg layer 116 serves as a cladding and current confinement layer. The III-V nitride cladding layer 116 typically has a thickness of from about 0.2 $\mu$m to about 1 $\mu$m.

A III-V nitride contact layer 118 is formed over the cladding layer 116. The p-type GaN:Mg layer 118 forms a p-contact layer for the minimum-resistance metal electrode to contact the p-side of the laser heterostructure 100. The III-V nitride contact layer 118 typically has a thickness of from about 10 nm to 200 nm.

The laser structure 100 can be fabricated by a technique such as metalorganic chemical vapor deposition (MOCVD) or molecular beam epitaxy as is well known in the art.

Dry-etching using CAIBE (chemical assisted ion beam etching) or RIE (reactive ion beam etching) in an $Ar/Cl_2/BCl_3$ gas mixture is used to etch the prior art laser structure 100 down to the GaN:Si current-spreading layer 106.

An n-type Ti/Al electrode 120 is formed on the etched, exposed n-current-spreading layer 106 of the laser 100, which is functioning as a lateral contact layer. A p-type Ni/Au electrode 122 is formed on the p-contact layer 118 of the laser 100.

P-type doping of InGaAlN layers is a key problem in the realization of GaN-based devices. It is difficult to achieve a high hole concentration in AlGaN alloys since the ionization energy of Mg acceptors is relatively high (~200 meV for Mg in GaN) and increases even further with higher Al content (~3 meV per % Al). Therefore, p-doped waveguide and cladding layers contribute significantly to the series resistance of the nitride-based laser structure, which results in higher operating voltages. Even in today's currently best violet nitride lasers, the operating voltages are on the order of 5 to 6 V, which is 2 to 3 V above the laser emission energy. For UV laser and LEDs, which require even higher Al compositions, the series resistance is going to be even larger. For a UV laser structure emitting around 340 nm the required Al composition for the cladding layers would be around 30%. The increase in Mg acceptor activation energy in the AGaN layer would result in an almost an order of magnitude drop in hole concentration compared to a Mg-doped GaN film.

In addition, the optimum growth temperatures for Mg-doped AlGaN layers is typically lower than the growth temperatures for Si-doped or un-doped AlGaN films, because of the improved Mg incorporation efficiency at lower temperatures. However, the structural quality of nitride-based semiconductor layers is reduced, when grown at a lower temperature, which deteriorates the structural and electronic properties of the upper cladding layers and upper waveguide layers in a III-V nitride laser structure.

Furthermore, in conventional InGaAlN laser diodes, GaN:Mg or InGaN:Mg are used as waveguiding layers and short period AlGaN/GaN supperlattice layers or bulk AlGaN layers doped with Mg are used as upper cladding layers. These Mg-doped layers have a significant absorption loss particularly in the blue to ultraviolet spectrum that a nitride based laser will emit light. For laser diodes operating close to the band gap of GaN (<400 nm), this leads to increased distributed loss and consequently to increased threshold current densities.

It is an object of this invention to provide a nitride based semiconductor laser structure with a reduced number of p-type semiconductor layers.

SUMMARY OF THE INVENTION

According to the present invention, a p-n tunnel junction between a p-type semiconductor layer and a n-type semiconductor layer provides current injection for an edge-emitting nitride based semiconductor laser structure. The p-n tunnel junction reduces the number of p-type semiconductor layers in the nitride based semiconductor laser structure which reduces the distributed loss, reduces the threshold current densities, reduces the overall series resistance and improves the structural quality of the laser by allowing higher growth temperatures.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DESCRIPTION OF THE INVENTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof.

Figure 1:
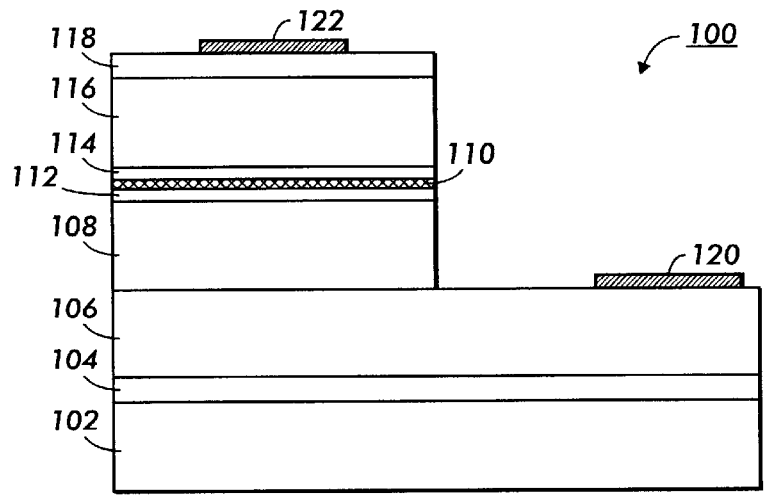
FIG. 1 is a side view of the prior art nitride semiconductor laser structure.
Figure 2:
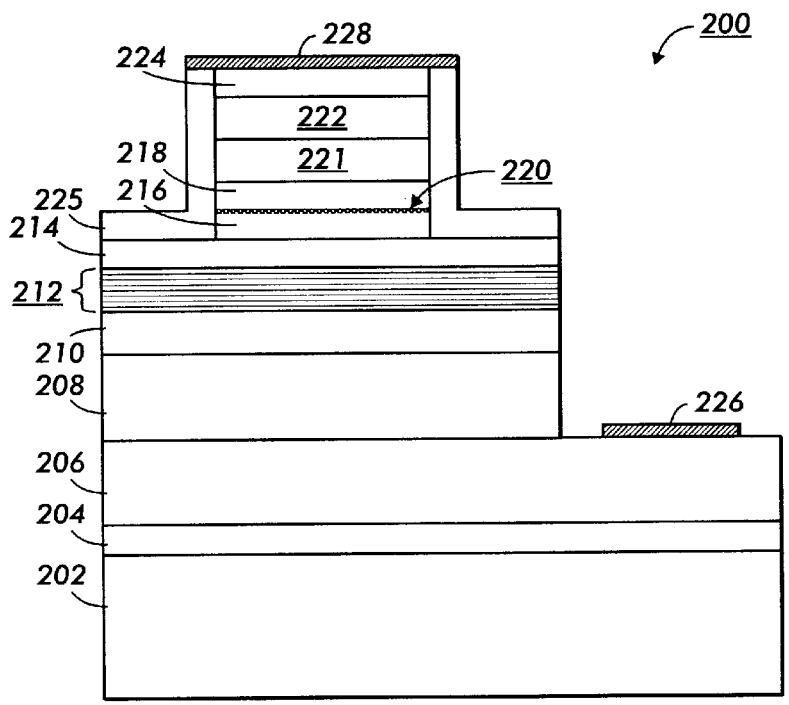
FIG. 2 is a side view of the nitride semiconductor laser structure with a p-n tunnel junction for current injection of the present invention.

Reference is now made to FIG. 2, wherein there is illustrated the nitride based semiconductor laser structure 200 with a p-n tunnel junction for current injection in accordance with this invention.

The nitride based semiconductor laser structure 200 of FIG. 2 has a C-face (0001) or A-face (1120) oriented sapphire ($Al_2O_3$) substrate 202 on which is epitaxially deposited a succession of semiconductor layers. The sapphire substrate 202 typically has a thickness of 200 micron to 1000 micron. The sapphire substrate is an illustrative example, other possible substrates for the laser structure 200 of the present invention include silicon carbide (SiC), spinel ($MgAl_2O_4$), aluminum nitride (AlN) or gallium nitride (GaN).

The laser structure 200 includes an n-type nucleation layer 204 formed on the sapphire substrate 202. Typically, the nucleation layer 204 is a binary or ternary III-V nitride material, such as, for example, GaN, AlN, InGaN or AlGaN. The nucleation layer 204 in this illustrative example is undoped GaN and has typically a thickness in the range between 10 nm and 30 nm.

A III-V nitride contact and current spreading layer 206 is formed on the nucleation layer 204. The III-V nitride layer 206 is an n-type GaN:Si layer acting as a lateral n-contact and current spreading layer. The contact and current spreading layer 206 typically has a thickness of from about 1 μm to about 20 μm. The III-V nitride layer 206 can alternately be n-type AlGaN:Si.

In the case when substrates like GaN or AlN are used, a nucleation layer is not required and the contact and current spreading layer then acts as a transition layer between the GaN or AlN substrate and the cladding layer. The transition layer can also be a graded $Al_xGa_{1-x}N$ layer with its Al composition x graded between the substrate and the cladding layer.

A III-V nitride cladding layer 208 is formed over the contact layer 206. The III-V nitride layer 208 is an n-type AlGaN:Si cladding layer with an Al content larger than the contact layer 206. The cladding layer 208 typically has a thickness of from about 0.2 µm to about 2 µm.

On top of the cladding layer 208, a III-V nitride waveguide layer 210 is formed followed by the III-V nitride quantum well active region 212. The n-type GaN:Si waveguide layer 210 typically has a thickness of from about 50 nm to about 200 nm. The waveguide layer 210 can also be GaN:un, AlGaN:un, AlGaN:Si, InGaN:un or InGaN:Si with a band gap energy larger than the InGaAlN quantum well in the active region 212. The quantum well active region 212 is comprised of at least one $In_xAl_yGa_{1-x-y}N$ quantum well (1>=x>=0, 1>=y>=0, 1>=x+y>=0). For multiple-quantum well active regions, the individual quantum wells typically have a thickness of from about 10 Å to about 100 Å and are separated by InGaN, AlGaN or GaN barrier layers which have typically a thickness of from about 10 Å to about 200 Å. The InGaAlN quantum wells and the InGaN, AlGaN or GaN barrier layers are typically undoped or can be Si-doped.

A III-V nitride electron blocking layer 214 is formed over the quantum well active region 212. The p-type AlGaN:Mg electron blocking layer 214 serves as a carrier confinement layer to keep electrons from leaking out of the active region 212. The acceptor concentration of the AlGaN electron blocking layer 116 is in the range between $1*10^{18}$ cm$^{-3}$ and $2*10^{20}$ cm$^{-3}$ and typically around $1*10^{20}$ cm$^{-3}$.

Figure 3:
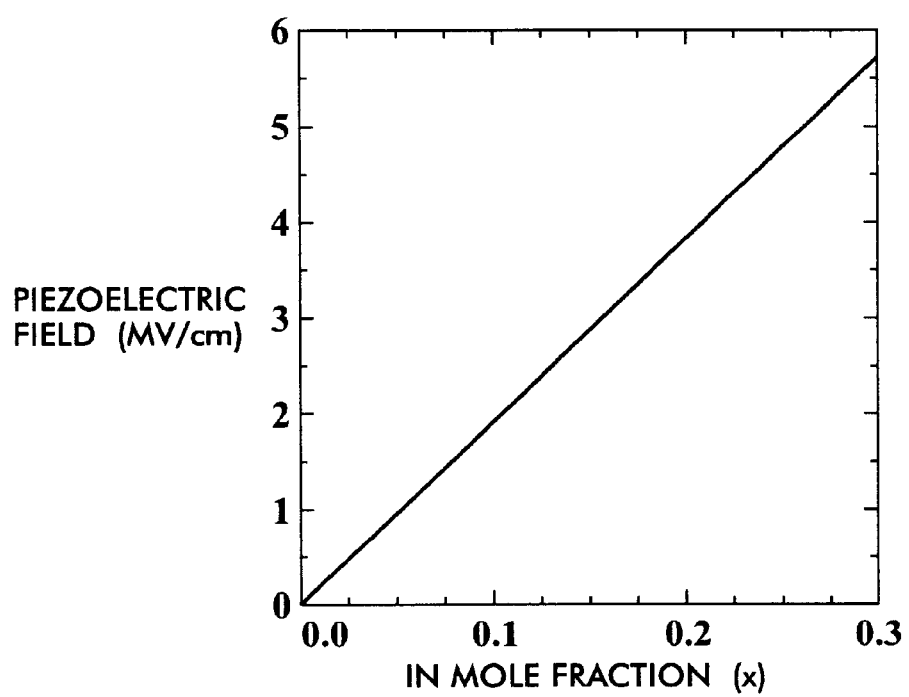
FIG. 3 is a graph of the strength of the piezo-electric field versus the indium content in InGaN layers in the nitride semiconductor laser structure with a p-n tunnel junction of FIG. 2.

The first part of the tunnel junction layer 216 is formed over the electron blocking layer 214. The highly p-type doped GaN:Mg layer 216 serves also as part of the waveguide layer and has a thickness between 10 nm and 100 nm and typically around 20 nm. The acceptor concentration of the GaN layer 216 is in the range between $1*10^{19}$ cm$^{-3}$ and $2*10^{20}$ cm$^{-3}$ and typically around approximately $1*10^{20}$ cm$^{-3}$. Alternatively the first part of the tunnel junction can be formed from highly p-type doped InGaN:Mg or InGaAlN:Mg. The tunnel probability increases exponentially with decreasing tunnel junction bandgap [~exp(-$E_{gap}^{1.5}$)] and therefore the lower bandgap $E_{gap}$ of the InGaN layer would reduce the operating voltage. In addition, the large polarization fields present in pseudomorphicaly strained InGaN films would add to the built-in field of the pn-junction and consequently increase the total electric field across the tunnel junction. As the tunnel probability increases exponentially with increasing tunnel junction field F [~exp(-1/F)], the larger total electric field across the tunnel junction would reduce the operating voltage. A calculated curve showing the strength of the piezoelectric field in InGaN films vs. the In composition is shown in FIG. 3. As can be seen, even at moderate In content of 10% the piezoelectric field in the layer is in the order of 2 MV/cm.

The second part of the tunnel junction layer 218 is formed over the first part of the tunnel junction layer 216. The highly n-type doped GaN:Si layer 218 serves also as part of the waveguide layer and has a thickness between 10 nm and 200 nm and typically around 20 nm. The n-doping level of the GaN layer 218 is in the range between $5*10^{18}$ cm$^{-3}$ and $1*10^{20}$ cm$^{-3}$ and typically around $5*10^{19}$ cm$^{-1}$. Alternatively the second part of the tunnel junction can be formed from highly n-type doped InGaN:Si or InGaAlN:Si. The motivation is similar as in the case of the first part of the tunnel junction layer. The tunnel probability increases exponentially with decreasing tunnel junction bandgap and increasing tunnel junction field F and therefore the lower bandgap $E_{gap}$ and the polarization field of the InGaN layer would reduce the operating voltage.

Alternatively, the second part of the tunnel junction 218 can be formed from highly n-type doped oxides such as ZnO, CdO, MgO, $SnO_2$ or $In_2O_3$. N-doping in these films is achieved with Al, Ga, In, F, Sn or Si with doping levels ranging between $1*10^{19}$ cm$^{-3}$ and $1*10^{21}$ cm$^{-3}$ and typically around $1*10^{20}$ cm$^{-1}$. ZnO, CdO, MgO, $SnO_2$ or $In_2O_3$ can be deposited by RF magnetron sputtering, pulsed laser deposition or MOCVD. Compounds of these oxides could also be used, e.g. $Cd_2SnO_4$. The advantage of using an oxide such as ZnO lies in the fact that the band offsets between ZnO and GaN are large, with both the valence band and conduction band of ZnO lying significantly lower in energy than the corresponding bands in GaN. This band alignment facilitates tunneling from the oxide conduction band into the nitride valence band. In addition, ZnO or other oxides with band gap exceeding that of the InAlGaN active layer are transparent to the light emitted from the active layer, hence optical absorption losses are small.

The tunnel junction 220 of the present invention is the interface between the p-(In)GaN:Mg layer 216 and the n-(In)GaN:Si layer 218 (or n-type ZnO, CdO, MgO, $SnO_2$, $In_2O_3$ layer). In order to avoid Mg p-dopant memory effects and to obtain a sharp p-n interface at the tunnel junction 220, a growth stop of typically 60 seconds to 600 seconds is introduced between deposition of the highly p- and n-doped layers 216 and 218. Alternatively, the sample can be taken out of the reactor and the surface can be etched (e.g. dry-etching) in order to remove any possible Mg accumulating at the surface.

Depending on the total thickness of the combined tunnel junction layers a III-V nitride layer 221 can be formed in order to complete the waveguide layer. The third part of the waveguide can be formed from GaN, InGaN, AlGaN or InGaAlN. The layer can be Si-doped or undoped layer and has a thickness between 0 nm and 200 nm and typically around 60 nm.

A III-V nitride or oxide cladding layer 222 is formed over the n-type waveguide layer 221 (or 218 if 221 is not formed). The n-type AlGaN:Si layer 222 serves as a cladding and current confinement layer. The cladding layer 222 typically has a thickness of from about 0.2 µm to about 1 µm. The cladding layer can also be formed from n-type ZnO, CdO, MgO, $SnO_2$, $In_2O_3$ layer, since most of these oxide layers have a refractive index around 2, which is smaller than that of InGaN or GaN. ZnO, CdO, MgO, $SnO_2$ or $In_2O_3$ can be deposited by RF magnetron sputtering, pulsed laser deposition or MOCVD. Compounds of these oxides could also be used, e.g. $Cd_2SnO_4$.

A III-V nitride or oxide contact layer 224 is formed over the cladding layer 222. The n-type GaN:Si layer 224 forms a contact layer for the minimum-resistance metal electrode to contact the p-side of the laser heterostructure 100. The contact layer 224 typically has a thickness of from about 10 nm to 200 nm. The contact layer can also be formed from n-type ZnO, CdO, MgO, $SnO_2$, $In_2O_3$ layer. Compounds of these oxides could also be used, e.g. $Cd_2SnO_4$.

The laser structure 200 can be fabricated by a technique such as metalorganic chemical vapor deposition (MOCVD) or molecular beam epitaxy as is well known in the art.

Dry-etching using CAIBE (chemical assisted ion beam etching) or RIE (reactive ion beam etching) in an Ar/Cl$_2$/BCl$_3$ gas mixture is used to etch a portion of the laser structure 200 down to the GaN:Si contact and current-spreading layer 206.

Dry-etching using CAIBE (chemical assisted ion beam etching) or RIE (reactive ion beam etching) in an Ar/Cl$_2$/BCl$_3$ gas mixture is used to etch a narrower portion of the laser structure 200 down to the electron blocking layer 214 in order to form a ridge-waveguide structure. The exposed etched surfaces can be covered with a insulating dielectric 225 like SiO$_2$, silicon-oxy-nitride or Si$_3$N$_4$, which can be deposited by e-beam evaporation, sputtering or CVD.

An n-type Ti/Al electrode 226 is formed on the etched, exposed n-current-spreading layer 206 of the laser 200, which is functioning as a lateral contact layer. A n-type Ti/Al electrode 228 used as the p-side electrode is formed on the p-side contact layer 224 of the laser 200.

The III-V nitride layers can be doped p-type or n-type by conventional processes. Examples of p-type dopants include, but are not limited to, Mg, Ca, C and Be. Examples of n-type dopants include, but are not limited to, Si, O, Se, and Te.

Current flowing between the electrodes 228 and 226 causes the nitride based semiconductor laser structure 200 to emit a light beam 230 from the active region 212 through the side 232 of the laser structure 200. The p-n tunnel junction 220 provides current injection from the p-side of the laser structure. The very high doping levels of p and n conductivity types on opposite sides of the tunnel junction 220 between the waveguide layers 216 and 218 (and in the case of a InGaN tunnel junction piezoelectric fields) cause a sufficient amount of carriers to tunnel from the conduction band of layer 120 into the valence band of layer 118. The voltage applied between the electrodes 228 and 226 reverse biases the tunnel junction 220 and the current flows across the junction by quantum mechanical tunneling with a relative small voltage drop.

The voltage drop across the tunnel junction 220 depends on the doping levels in the layers 216 and 218 bounding the junction, on the band gap of the materials of these layers, and on the band offsets between these layers in the case of a heterojunction. Using as high a doping level as possible in the layers 216 and 218 minimizes the voltage drop across the tunnel junction. The voltage drop across the tunnel junction is further reduced by piezoelectric fields if InGaN layers are use in the tunnel junction.

This invention proposes a nitride based semiconductor laser structure 200 with a p-n tunnel junction 220 for current injection from the p-side of the structure.

The absorption or distributed optical loss in the nitride based semiconductor laser structure 200 and therefore the threshold current densities for the nitride based semiconductor laser structure 200 are reduced by eliminating almost all p-doped layers from the device structure (i.e. the upper p-GaN:Mg waveguide layer, the upper p-AlGaN:Mg cladding layer and the upper p-GaN:Mg contact layer). The reduction in optical loss by using a p-n tunnel junction 220 for current injection is particularly useful for nitride based semiconductor lasers which emit light in the near UV and UV spectrum. The reduction in threshold current densities by using a p-n tunnel junction 220 for current injection is particularly useful for nitride based semiconductor lasers which have high current densities relative to laser structures fabricated from arsenides and other semiconductor materials.

Replacing the p-doped semiconductor layers with more conductive n-doped semiconductor layers in the nitride based semiconductor laser structure 200 with a p-n tunnel junction 220 for current injection reduces the overall series resistance of the laser structure, since most of the excess voltage drop is across the p-layers and p-contact. Although the additional voltage required for current injection through the p-n tunnel junction will offset this benefit somewhat, the net operating voltage of the nitride based semiconductor laser structure should not increase if the tunnel junction is properly designed with thin layers and high doping concentrations.

In addition, the large voltage drop across the p-layers reduces the efficiency of the AlGaN electron blocking layer in a conventional laser structure. The resistance in a tunnel junction laser structure depends only on the tunnel current and not on the conductivity of the p-layers (as in the conventional laser structure) and therefore the voltage drop across the electron blocking layer should be smaller.

Furthermore the structural quality of the upper cladding and waveguide layers could be improved, because eliminating p-doping makes higher growth temperatures and better growth control possible, which is preferable for high quality GaN layers.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A semiconductor laser structure comprising:
   a substrate;
   a plurality of III-V nitride semiconductor layers formed on said substrate, at least one of said plurality of III-V nitride semiconductor layers forms an active region over a n-type cladding layer;
   a first semiconductor layer being p-type nitride material formed on the active region, the first semiconductor layer including a blocking layer to prevent leakage of electrons injected into the active layer from leaking out of the blocking layer, the first semiconductor layer further including a hole injection layer over the blocking layer, the bandgap of the blocking layer being larger than the bandgap of the hole injection layer;
   a second semiconductor layer formed on said first semiconductor layer, said second semiconductor layer being an n-type nitride, a tunnel junction disposed between said first semiconductor layer and said second semiconductor layer for injecting current into said active region, said blocking layer preventing electrons from leaking from said blocking layer to the tunnel junction; and
   wherein a sufficient forward bias is applied to said active region to cause lasing from an edge of said semiconductor laser structure.

2. The semiconductor laser structure of claim 1 wherein said first semiconductor layer is a p-type III-V nitride semiconductor, and said second semiconductor layer is an n-type III-V nitride semiconductor.

3. The semiconductor laser structure of claim 1 wherein said first semiconductor layer is a p-type III-V nitride semiconductor, and said second semiconductor layer is an n-type oxide semiconductor.

4. The semiconductor laser structure of claim 1 wherein a plurality of said plurality of III-V nitride semiconductor layers are n-type.

5. The semiconductor laser structure of claim 1 wherein said tunnel junction means is reverse biased.

6. The semiconductor laser structure of claim 1 wherein one of said plurality of III-V nitride semiconductor layers is a electron blocking layer formed on said active region, said electron blocking layer is a p-type III-V nitride semiconductor, and said first semiconductor layer is formed on said electron blocking layer.

7. The semiconductor laser structure of claim 1 wherein said substrate is sapphire, silicon carbide, spinel, aluminum nitride or gallium nitride.

8. A semiconductor laser comprising:

a substrate;

a first n-type III-V compound nitride layer deposited over the substrate;

an active region formed over the first n-type III-V compound nitride layer;

a p-type III-V compound nitride layer deposited over the active region, the p-type III-V compound nitride layer including a blocking layer with a bandgap larger than the bandgap of the first n-type III-V compound nitride layer to prevent electrons injected into the active region from leaking past the blocking layer and reaching a tunnel junction, the p-type III-V compound nitride layer further including a hole-injection layer over the blocking layer, the hole-injection layer having a bandgap smaller than the bandgap of the blocking layer;

a second n-type III-V compound nitride layer formed over the p-type III-V compound nitride layer the second n-type III-V compound nitride layer forming a tunnel diode with the hole-injection layer.

9. The semiconductor laser of claim 8 wherein the interface between the p-type III-V compound nitride layer and the second n-type III-V compound nitride layer is reverse biased.

10. The semiconductor laser of claim 9 wherein the interface between the p-type III-V compound nitride layer and the first n-type III-V compound nitride layer is forward biased.

11. The semiconductor laser of claim 8 wherein the III-V compound nitride layer is a gallium nitride layer.

12. The semiconductor laser of claim 8 wherein substrate is a sapphire substrate.

13. The semiconductor laser of claim 8 wherein the active layer is an intrinsic.

* * * * *